United States Patent
Chang et al.

(10) Patent No.: US 12,190,927 B2
(45) Date of Patent: Jan. 7, 2025

(54) MEMORY DEVICE WITH A BIAS CIRCUIT

(71) Applicant: Taiwan Semiconductor Manufacturing Company, Ltd., Hsinchu (TW)

(72) Inventors: Meng-Sheng Chang, Hsinchu (TW); Chia-En Huang, Hsinchu (TW); Gu-Huan Li, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/407,875

(22) Filed: Aug. 20, 2021

(65) Prior Publication Data

US 2023/0054577 A1    Feb. 23, 2023

(51) Int. Cl.
    *G11C 11/16*      (2006.01)

(52) U.S. Cl.
    CPC ...... *G11C 11/1657* (2013.01); *G11C 11/1655* (2013.01); *G11C 11/1673* (2013.01); *G11C 11/1675* (2013.01)

(58) Field of Classification Search
    CPC ............ G11C 11/1675; G11C 11/1673; G11C 11/1655; G11C 11/1657

USPC ........................................... 365/158
See application file for complete search history.

(56) References Cited

U.S. PATENT DOCUMENTS

| | | | | |
|---|---|---|---|---|
| 9,502,091 B1 * | 11/2016 | Jung | .................... | G11C 11/4091 |
| 2006/0227598 A1 * | 10/2006 | Sakimura | ................. | G11C 11/15 |
| | | | | 365/158 |
| 2009/0180315 A1 * | 7/2009 | Yoon | .................... | G11C 11/1673 |
| | | | | 365/171 |
| 2010/0073992 A1 * | 3/2010 | Ueda | .................... | G11C 11/1659 |
| | | | | 365/158 |
| 2013/0294150 A1 * | 11/2013 | Li | .................... | G11C 29/50008 |
| | | | | 365/158 |
| 2016/0293268 A1 * | 10/2016 | Jan | .......................... | G11C 17/18 |
| 2022/0310146 A1 * | 9/2022 | Xing | .................... | G11C 11/1659 |

* cited by examiner

*Primary Examiner* — Sung Il Cho
(74) *Attorney, Agent, or Firm* — Merchant & Gould P.C.

(57) ABSTRACT

A method for operating a memory device is provided. A first address is decoded to select a bit line of a memory device. A second address is decoded to select a word line of the memory device. A word line voltage is applied to the selected word line. A bit line voltage is applied to the selected bit line. A first bias voltage is applied to each of a plurality of unselected word lines connected to a plurality of memory cells connected to the selected bit line san a memory cell connected to both the selected bit line and the selected word line.

20 Claims, 5 Drawing Sheets

MEMORY DEVICE WITH A BIAS CIRCUIT

BACKGROUND

Many modern day electronic devices contain electronic memory configured to store data. Electronic memory can be a volatile memory or a non-volatile memory. A volatile memory stores data when it is powered while a nonvolatile memory device is capable of retaining data even after power is cut off. Examples of nonvolatile memory devices include flash memory, ferroelectric random access memories (FRAMs), phase-change random access memories (PRAMs), and magnetic random access memories (MRAMs). MRAMs store data in magnetic storage elements.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the invention and are not intended to be limiting.

DETAILED DESCRIPTION

Figure 1:
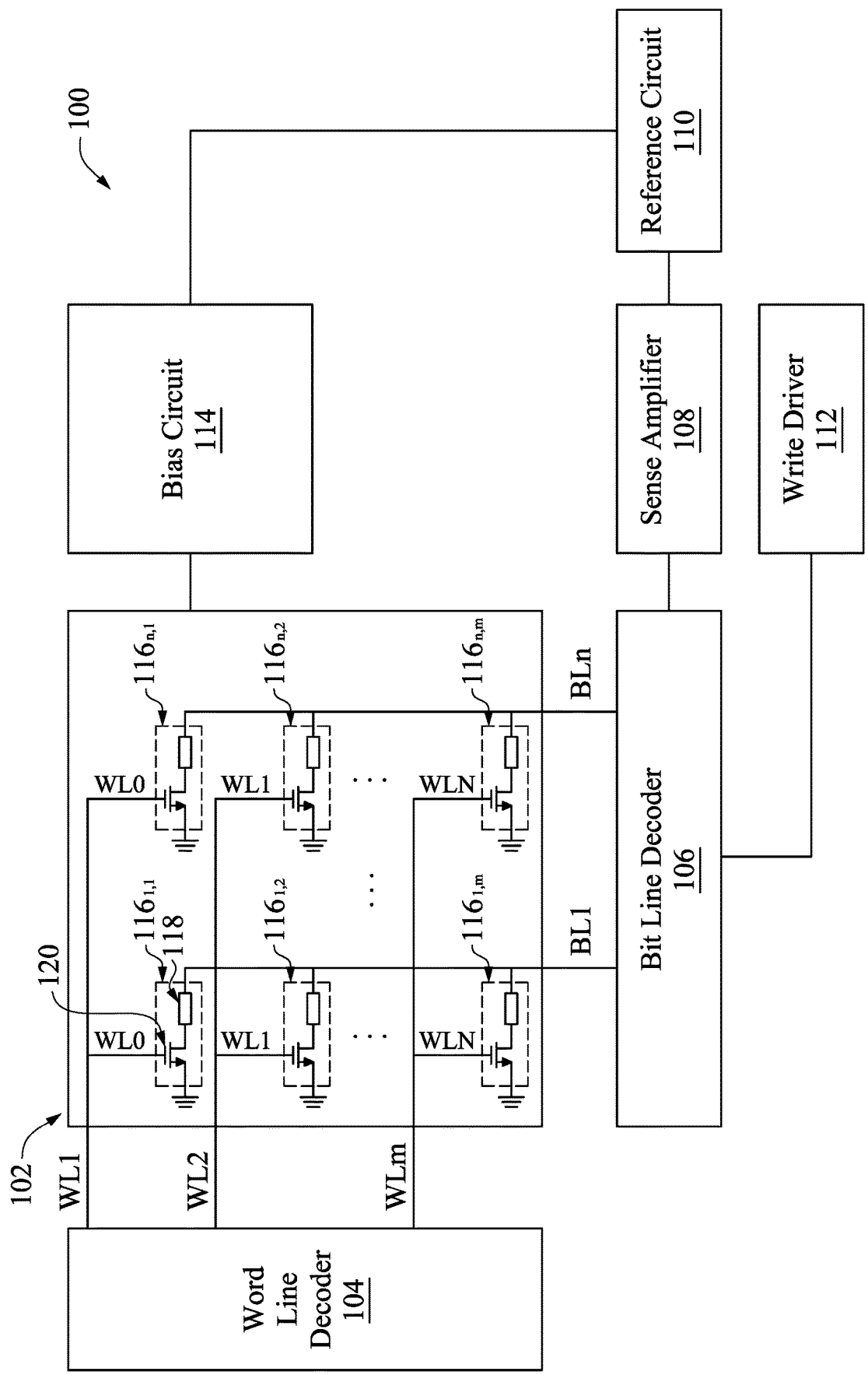
FIG. 1 is a block diagram of an example memory device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Certain types of memory devices, such as MRAM, have two or more resistance states depending on the state of magnetization alignment between two or more layers of magnetic materials, such as ferromagnetic materials. The resistance of a memory cell can be compared to a reference to determine the resistance state of the memory cell. As the density of memory cells increases, the requirement for proper setting of the reference relative to the memory cells becomes more stringent.

More particularly, MRAM stores data at memory cells having two superimposed layers of magnetic material separated by a thin insulating film. The layered structure forms a magnetic tunnel junction ("MTJ" or "MTJ element") of an MRAM cell. The two layers include a magnetic layer that is permanently magnetized in a fixed magnetic field alignment direction (this layer is referred to as a "pinned layer") and a changeably-magnetized magnetic layer (this layer is referred to as a "free layer"). The free layer can be magnetized in one of two orientations relative to the permanently magnetized layer. The two orientations are characterized by distinctly different serial resistances through the superimposed layers of the MTJ. The magnetic field orientation of the changeable layer can be aligned the same as that of the permanent magnet layer (parallel) or opposite to that of the permanent magnet layer (anti-parallel). The parallel alignment state has a relatively lower resistance and the anti-parallel alignment state has a higher resistance.

FIG. 1 is a block diagram generally illustrating an example memory device 100 in accordance with some embodiments. In the example shown, memory device 100 includes a memory cell array 102 (also referred to as a memory array or a cell array), a word line decoder 104, a bit-line decoder 106, a sense amplifier 108, a reference circuit 110, a write driver 112, and a bias circuit 114. Sense amplifier 108 and reference circuit 110 together are also referred to as a read circuit or a read driver. It will be apparent to a person with skill in the art after reading this disclosure that memory device 100 can include additional elements than that shown in FIG. 1. In examples, memory device 100 is a non-volatile memory device, including, e.g., a magnetoresistive random access memory (MRAM). In other examples, memory device 100 is a volatile memory device. In certain examples, memory device 100 is a read-only memory device.

Memory cell array 102 of memory device 100 includes a plurality of the memory cells (labeled as $116_{1,1}$, $116_{1,2}, \ldots, 116_{1,m}, \ldots, 116_{n,1}, 116_{n,1}, \ldots, 116_{n,m}$ (collectively referred to as plurality of memory cells or memory cells)). Each of the plurality of memory cells 116 store a bit value 0 or 1 of data therein and allow a read current (Iread) to flow therethrough. The plurality memory cells of memory cell array 102 are arranged in an array of rows and columns, for example, m rows and n columns. Each row includes a first plurality of memory cells and each column includes a second plurality of memory cells.

Memory device 100 further includes a plurality of word lines (labeled as WL1, WL2, . . . , WLm, etc.) and a plurality of bit lines (labeled as BL1, . . . , BLn, etc.). The word line WL1 connects each of the first plurality of memory cells in a first row, the word line WL2 connects each of the first plurality of memory cells in the second row, continuing to the word line WLm which connects each of the first plurality memory cells in the mth row. The bit line BL1 connects each of the second plurality of memory cells in a first column continuing to the bit line BLn which connects each of the second plurality of memory cells in the nth column. Therefore, in the example shown, memory cell array 102 includes m rows, n columns, and m x n memory cells 116. The bit lines BL1, . . . , BLn, etc., can be selectively connected to sense amplifier 108 via switches (not shown) depending on exactly which memory cell in the array is to be read to or to write driver 112 to be written from. Each of the plurality of cells of memory cell array 102 are defined by an intersection of a word line and a bit line.

Because the plurality of memory cells of memory cell array 102 are the same in construction and operation, only one, i.e., memory cell $116_{1,1}$, will be described here. In this example, memory cell $116_{1,1}$ includes a resistive element 118 and a transistor 120. Transistor 120 is also referred to as an access transistor and can be a field-effect transistor (FET), e.g., a metal-oxide semiconductor FET (MOSFET), a complementary metal oxide semiconductor (CMOS), a n-channel metal oxide semiconductor (NMOS), a p-channel metal oxide semiconductor (PMOS), or the like. Transistor 120 includes a source connected to the ground, a drain connected to a first terminal of resistive element 118, and a gate connected to the word line WL1. In an alternative embodiment, memory device 100 can include source lines SL. In such an alternative embodiment, the source of transistor 120 is connected to the first source line SL1 instead of the ground. In examples, transistor 120 is symmetrical. That is, the source of transistor 120 can be the drain and the drain of transistor 120 can be the source.

Resistive element 118 is connected between the drain of transistor 120 and the bit line BL1. For example, the first terminal of resistive element 118 is connected to the drain of memory cell $116_{1,1}$ and a second terminal of resistive element 118 is connected to the bit line BL1. In examples, resistive element 118 is an MTJ and has a resistive state that is switchable between a low resistive state and high resistive state. Resistive element 118 may be any type of resistive element or circuit so long as it achieves the intended function described herein.

Word line decoder 104 decodes a first address to select one of the plurality of word lines and apply a word line voltage to the selected word line for a read or a write operation in memory cell array 102. In examples, the word line voltage applied to the selected word line can be different from a read operation and a write operation. Bit line decoder 106 is connected to memory cell array 102 and decodes a second address to select one of the plurality of bit lines and apply a predetermined bit line voltage to the selected bit line for a read or a write operation in memory cell array 102.

Sense amplifier 108 compares a read current (Iread) (also referred to as a cell current (Icell)) with a reference current (Iref) and determines a bit value (that is, 0 or 1) stored in a selected memory cell of memory cell array 102 during a read operation. For example, when the read current (Iread) is less than the reference current (Iref), sense amplifier 108 senses a bit value 1. Conversely, when the read current (Iread) is more than the reference current (Iref), sense amplifier 108 senses a bit value 0. In some examples, sense amplifier 108 amplifies the level of the sensed bit of data and provides the amplified bit of data as an output, such that the bit of data can be read from the selected memory cell. In examples, sense amplifier 108 can be a differential sense amplifier or a single ended sense amplifier. Read operation is discussed in a greater detail with reference to FIGS. 4 and 5 of the specification.

Reference circuit 110 generates the reference current (Iref). In some examples, the reference current (Iref) can be approximately equal to 25 uA. Other reference current (Iref) levels are within the scope of the disclosure. The reference current (Iref) flows between sense amplifier 108 and reference circuit 110. For example, the reference current (Iref) can flow from reference circuit 110 to sense amplifier 108 or vice versa. In examples, the levels of the read current (Iread) and the reference current (Iref) are dictated by the resistances of respective memory cell array 102 and reference circuit 110.

Write driver 112 (also referred to as a write drive circuit or a program circuit) programs or writes data into one or more memory cells of the plurality of memory cells of memory cell array 102 during a write operation. Write operation is discussed in a greater detail with reference to FIGS. 2 and 3 of the specification. In some examples, one or both of reference circuit 110 and write driver 112 can be part of sense amplifier 108.

Bias circuit 114 selectively applies a first bias voltage to word lines coupled to unselected memory cells within a column of memory cell array 102. In examples, the first bias voltage is less than 0 volt, for example, −0.3 volt. In addition, bias circuit 114 selectively applies a second bias voltage to a transistor of a reference memory cell of reference circuit 110. In examples, the second bias voltage is more than a supply voltage. In some examples, the first bias voltage and the second bias voltage are applied during a read operation. Thus, bias circuit 114 is only active during a read operation. In examples, bias circuit 114 may include one or more of a negative voltage generator, a charge pump, a boost circuit, and a low dropout voltage regulator circuit to generate the first bias voltage and the second bias voltage.

Figure 2:
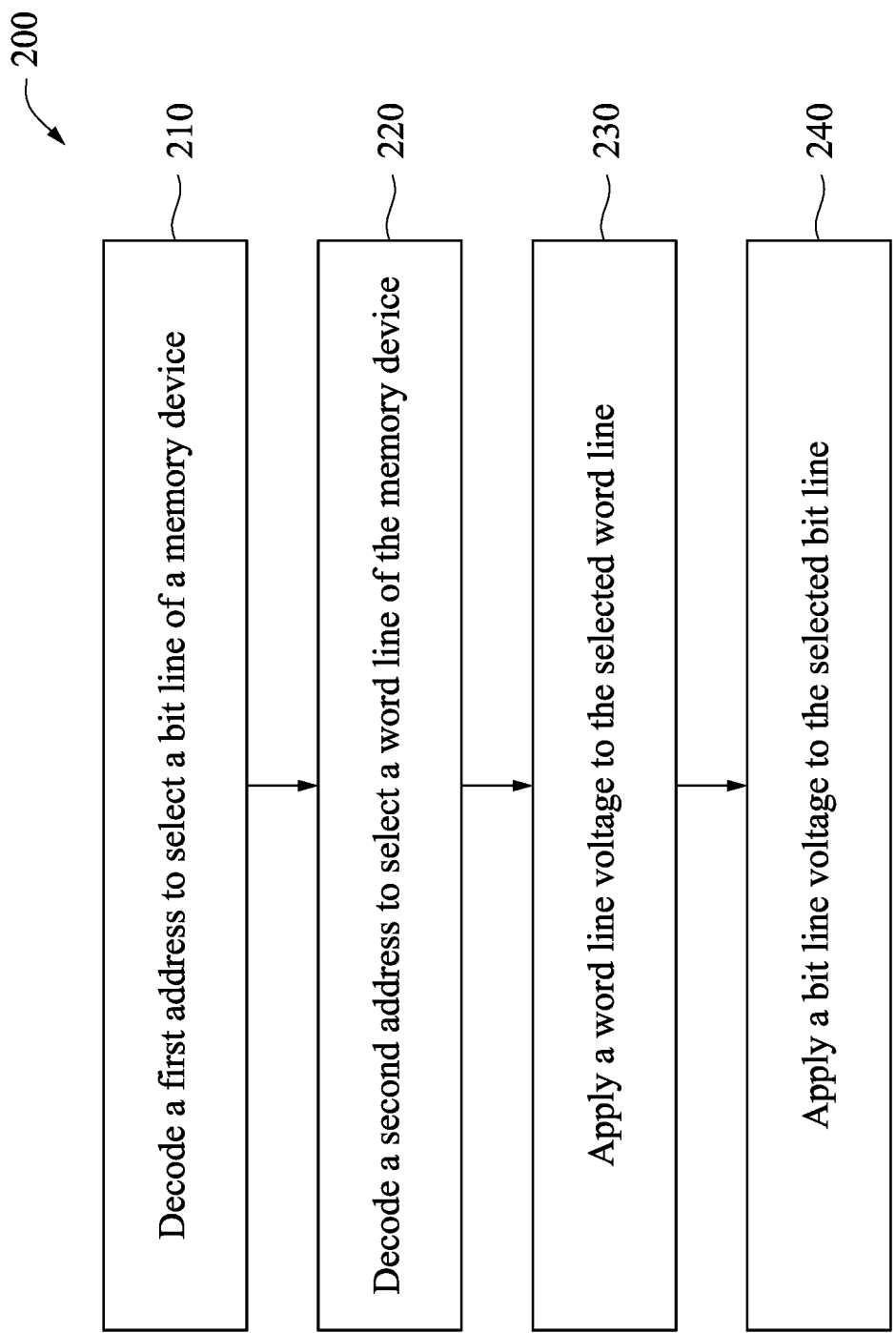
FIG. 2 is a flow diagram of an example method of a write operation in a memory device in accordance with some embodiments.

FIG. 2 is a flow diagram of a method 200 of write operation in memory device 100 in accordance with some embodiments. The write operation discussed with respect to method 200 is used for writing data into one or more memory cells of memory cell array 102 of memory device 100 and is also referred to as programing of memory device 100. Method 200 will be described in conjugation with FIG. 3, which is a partial block cum circuit diagram illustrating a write path of memory device 100, and shows different voltages applied during the write operation.

Figure 3:
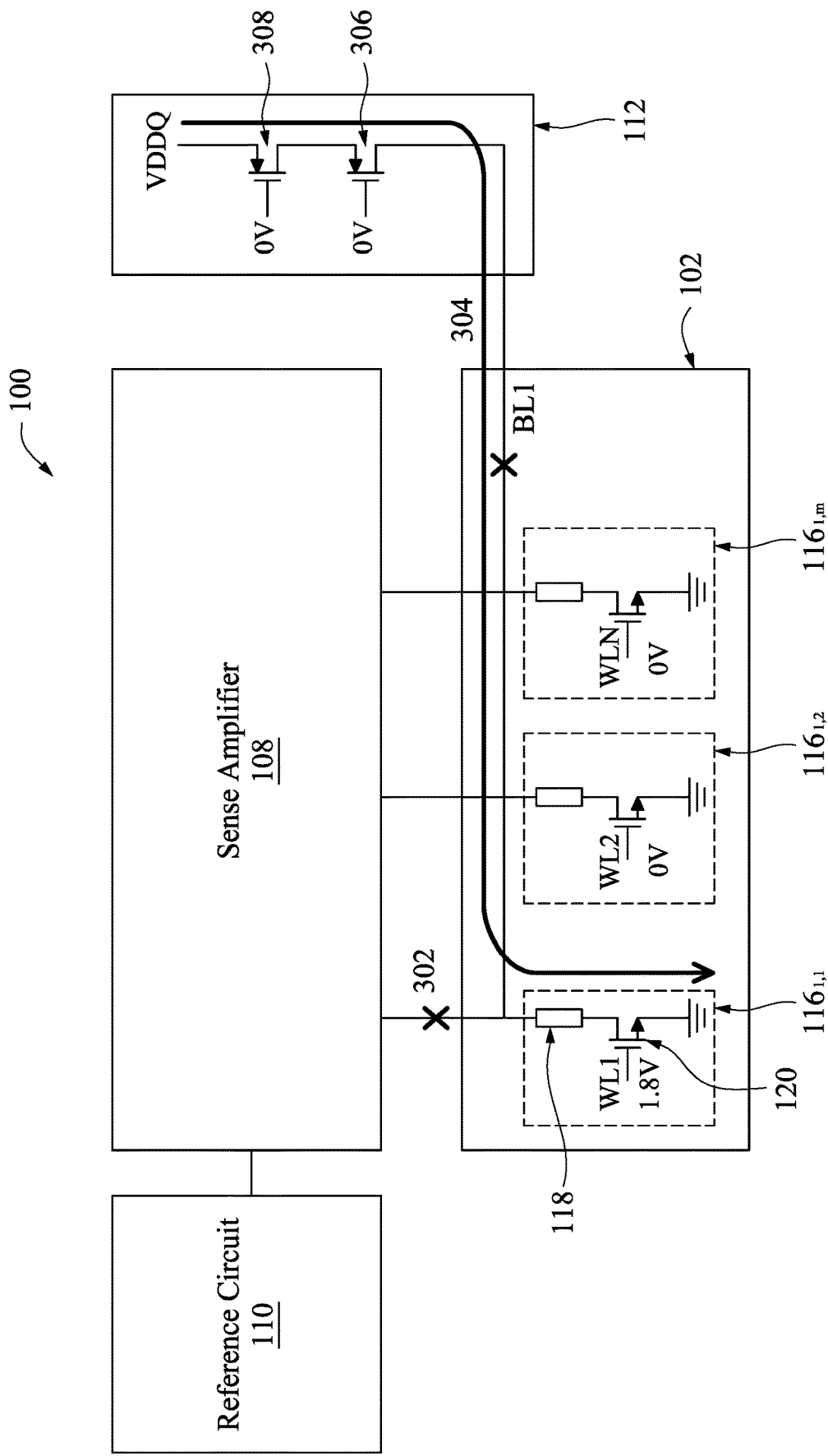
FIG. 3 is a partial block cum circuit diagram of a memory device illustrating a write path in accordance with some embodiments.

As shown in FIG. 3, for the write operation, a read path 302 which connects sense amplifier 108 and reference circuit 110 to memory cell array 102 is disabled or disconnected. In addition, and as shown in FIG. 3, for the write operation, a write path 304, which connects write driver 112 to memory cell array 102 is enabled or connected.

Continuing with FIG. 3, write driver 112 includes a write driver first transistor 306 and a write driver second transistor 308. In examples, each of write driver first transistor 306 and write driver second transistor 308 is a PMOS transistor. However, other types of transistors, such as an NMOS transistor, a CMOS transistor, and a MOSFET can be used for both of write driver first transistor 306 and write driver second transistor 308. Although, only two transistors are shown in FIG. 3, write driver 112 can include more than two transistors.

In examples, each of write driver first transistor 306 and write driver second transistor 308 includes a source, drain, and a gate. The drain of write driver first transistor 306 is connectable to the selected bit line BL1. The source of write driver first transistor 306 is connected to the drain of write driver second transistor 308. The source of write driver second transistor 308 is connected to a write voltage node (VDDQ). In examples, the write voltage (VDDQ) node is at a voltage level greater than a supply voltage. For example, the write voltage (VDDQ) node is at a voltage level is equal to 1.8 volts. Gates of each of write driver first transistor 306 and write driver second transistor 308 are connected either to a first voltage (for example, 0 volts to switch it on) and to a second voltage (for example, 1.8 volts to turn it off). In examples, both write driver first transistor 306 and write driver second transistor 308 are switched on for the write operation. Write driver first transistor 306 and write driver second transistor 308 are switched on by applying the first voltage (that is, 0 volt) at the gates of write driver first transistor 306 and write driver second transistor 308. In examples, it will be apparent to a person with skill in the art after reading this disclosure that 1.8 volts for the write voltage (VDDQ) node and 0 volt for gate voltages are exemplary, and other voltage levels can be used.

Each of write driver first transistor 306 and write driver second transistor 308 is symmetrical. That is, a source of each of write driver first transistor 306 and write driver second transistor 308 can be a drain, and a drain of each of write driver first transistor 306 and write driver second transistor 308 can be a source.

Referring to FIG. 2, at block 210 of method 200, a first address is decoded to select a bit line of memory device 100. For example, bit line decoder 106 receives a first address and decodes the first address to select a bit line, for example, the bit line BL1, of memory cell array 102 of memory device 100. As shown in FIG. 3, the bit line BL1 is associated with the first row of memory cell array 102 and is connected to each of the second plurality of memory cells (labeled as $116_{1,1}$, $116_{1,2}$, . . . , $116_{1,m}$) of the first row.

Referring back to FIG. 2, at block 220 of method 200, a second address is decoded to select a word line of memory device 100. For example, word line decoder 104 receives a second address and decodes the second address to select a word line, for example, the word line WL1 of memory cell array 102 of memory device 100. The selected word line WL1 is connected to memory cell $116_{1,1}$ of the first column of memory cell array 102 of memory device 100. Memory cell $116_{1,1}$ is thus connected to both the selected bit line BL1 and the selected word line WL1 and is located at an intersection of the selected bit line BL1 and the selected word line WL1. To select other cells, different combinations of bit lines and word lines are selected. The remaining memory cells of the first column (that is, memory cell $116_{1,2}$, . . . , and memory cell $116_{1,m}$) are referred to unselected memory cells.

At block 230 of method 200, a word line voltage is applied to the selected word line. In examples, and as shown in FIG. 3, the word line voltage applied to the selected word line WL1 for the write operation is 1.8 volts. However, other voltages are possible for the word line voltage. The word line WL1 is connected to a gate of memory cell $116_{1,1}$. Therefore, applying the word line voltage switches on transistor 120 of memory cell $116_{1,1}$ thereby connecting the second terminal of resistive element 118 of memory cell $116_{1,1}$ to the ground. In examples, the word line voltage applied to the selected word line WL1 during the write operation is also referred to as a word line write voltage or a first word line voltage.

Referring back to FIG. 2, at block 240 of method 200, a bit line voltage is applied to the selected bit line. For example, the bit line voltage is applied through write path 304 by write driver 112. That is, the bit line BL1 is connected to the write voltage (VDDQ) through write driver 112. Hence, during the write operation, a write a write current flows through memory cell $116_{1,1}$. That write current also flows through resistive element 118 causing resistive element 118 to switch from a parallel state to an anti-parallel state or vice versa, where a bit of data is written and stored in memory cell memory cell $116_{1,1}$.

In examples, when it is desired to switch resistive element 118 from the anti-parallel state to the parallel state to store 0 value, a switch current is passed through resistive element 118 from the free layer to the reference layer. Conversely, when it is desired to switch resistive element 118 from the parallel state to the anti-parallel state to store 1 value, a switch current is passed through resistive element from the reference layer to the free layer.

In examples, when the free layer of resistive element 118 is in the parallel state, resistive element 118 exhibits a low resistance that represents a logic 0 value and resistive element 118 is said to be in a parallel state or a low resistance state. Conversely, when the free layer is in the anti-parallel state, resistive element 118 exhibits a high resistance that represents a logic 1 value and resistive element 118 is said to be in an anti-parallel state or a high resistance state. In some examples, the logic represented by resistive element 118 in a high or low resistance state is arbitrary, e.g. the logic "1" can be represented by resistive element 118 in a low resistance state and the logic "0" can be represented by resistive element 118 in a high resistance, and is determined by the desired convention used for the memory device. Whichever convention is chosen, resistive element 118 can store binary data via two writeable and readable states, e.g. the high resistance and low resistance states. For purposes of consistency, embodiments described herein will use the convention that resistive element 118 in the low resistance state represents a "0" and resistive element 118 in the high resistance state represents a "1," unless otherwise stated.

Figure 4:
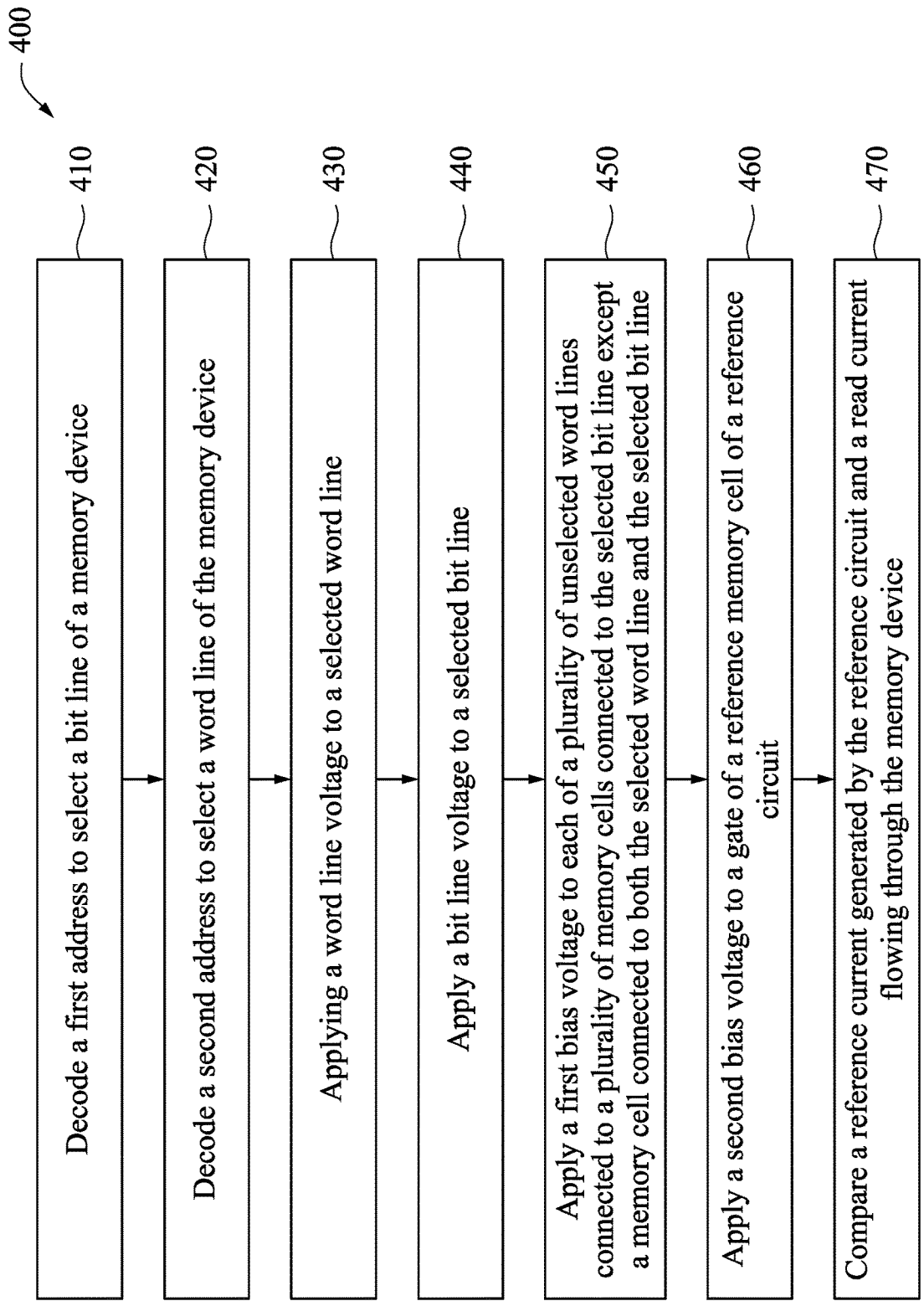
FIG. 4 is a flow diagram of an example method of a read operation in a memory device in accordance with some embodiments.

FIG. 4 is a flow diagram of a method 400 for performing a read operation in memory device 100 in accordance with some embodiments. The read operation disclosed in method 400 is also referred to as a method for reading data from one or more memory cells of memory cell array 102 of memory device 100. Method 400 will be described in conjugation with FIG. 5, which is another partial block cum circuit diagram illustrating a read path of memory device 100, and shows different voltages applied during the read operation.

Figure 5:
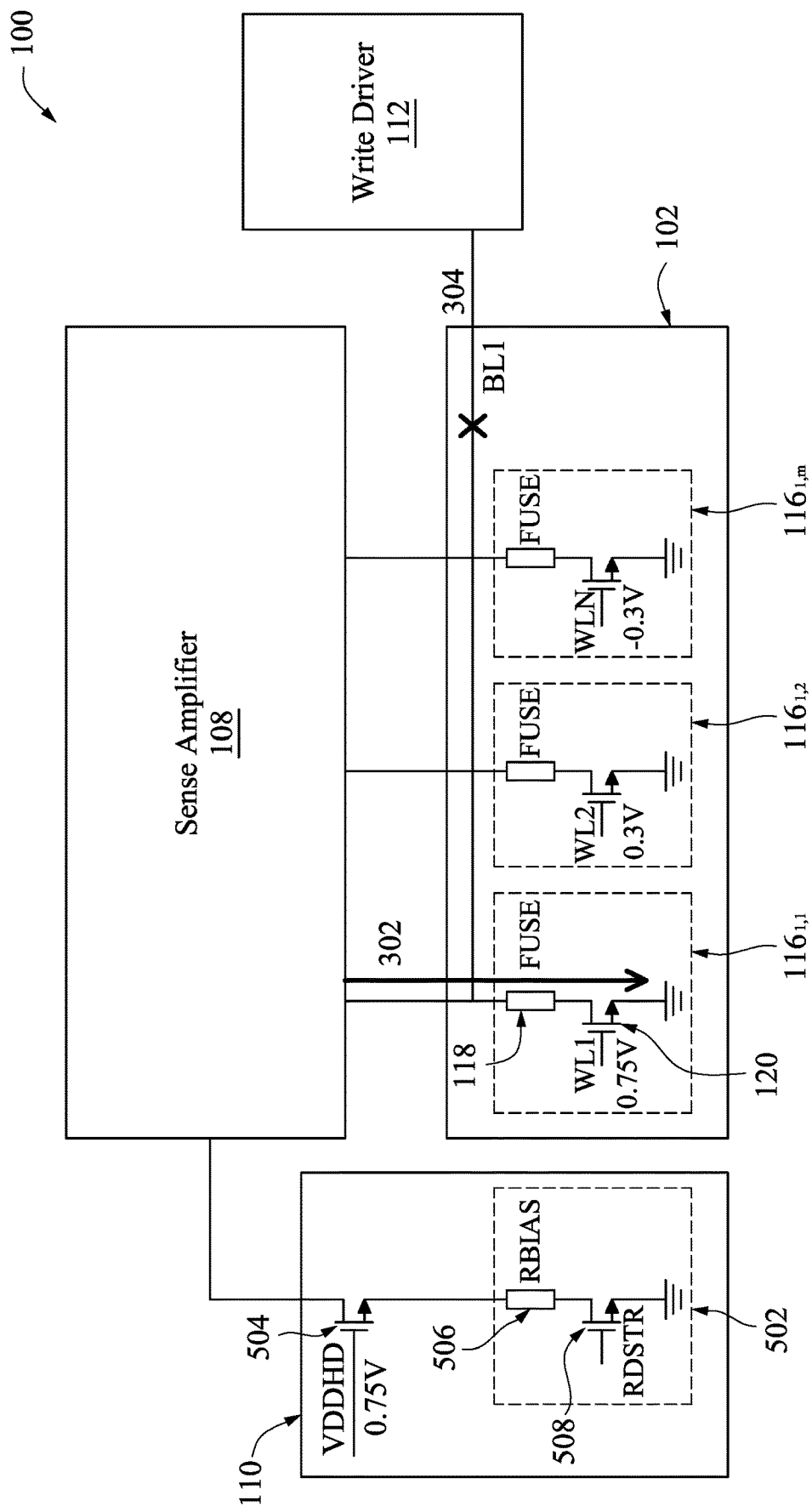
FIG. 5 is a partial block cum circuit diagram of a memory device illustrating a read path in accordance with some embodiments.

As shown in FIG. 5, and prior to initiating the read operation, read path 302 which connects sense amplifier 108 and reference circuit 110 to memory cell array 102 is enabled or connected. In addition, and as shown in FIG. 5, for the read operation, write path 304, which connects write driver 112 to memory cell array 102 is disabled or disconnected.

Continuing with FIG. 5, reference circuit 110 includes a reference memory cell 502 and a reference circuit transistor 504. Reference memory cell 502 includes a reference memory cell resistive element 506 and a reference memory cell transistor 508. In examples, reference memory cell 502 is similar to or identical to memory cell $116_{1,1}$ of memory cell array 102. In some examples, reference memory cell resistive element 506 is in an anti-parallel state. Although reference circuit 110 is shown to include only one reference memory cell 502, it can include multiple reference memory cells connected to each other in a series, in a parallel, or a combination of series and parallel. In examples, each of reference circuit transistor 504 and reference memory cell transistor 508 is a NMOS transistor. However, other types of transistors, such as an PMOS transistor, a CMOS transistor, and a MOSFET can be used for both of reference circuit transistor 504 and reference memory cell transistor 508.

In examples, each of reference circuit transistor 504 and reference memory cell transistor 508 includes a source, drain, and a gate. The drain of reference circuit transistor 504 is connected to sense amplifier 108. The source of reference circuit transistor 504 is connected to a first terminal of reference memory cell resistive element 506. A second terminal of reference memory cell resistive element 506 is connected to the drain of reference memory cell transistor 508. The source of reference memory cell transistor 508 is connected to the ground. The gate of reference circuit transistor 504 is connected to a supply voltage. The gate of reference memory cell transistor 508 is connected to bias circuit 114. In example, the supply voltage is approximately equal to 0.75 volts. However, other voltages are possible for the supply voltage.

In examples, each of reference circuit transistor 504 and reference memory cell transistor 508 is symmetrical. That is, a source of each of reference circuit transistor 504 and reference memory cell transistor 508 can be a drain, and a drain of each of reference circuit transistor 504 and reference memory cell transistor 508 can be a source.

Referring to FIG. 4, at block 410 of method 400, a first address is decoded to select a bit line of memory device 100. For example, bit line decoder 106 receives a first address and decodes the first address to select a bit line, for example, the bit line BL1, of memory cell array 102 of memory device 100. As shown in FIG. 5, the bit line BL1 is associated with the first column of memory cell array 102 and is connected to each of the second plurality of memory cells (labeled as $116_{1,1}$, $116_{1,2}$, . . . , $116_{1,m}$) of the first column.

Referring back to FIG. 4, at block 420 of method 400, a second address is decoded to select a word line of memory device 100. For example, word line decoder 104 receives a second address and decodes the second address to select a word line, for example, the word line WL1 of memory cell array 102 of memory device 100. The selected word line WL1 is connected to memory cell $116_{1,1}$ of the first column of memory cell array 102 of memory device 100. Memory cell $116_{1,1}$ is thus located as an intersection of the selected bit line BL1 and the selected word line WL1. To select other cells, different combinations of bit lines and word lines are selected.

At block 430 of method 400, a word line voltage is applied to the selected word line. For example, and as shown in FIG. 5, a voltage of 0.75 volt is applied to the word line WL1. However, other voltages are possible for the word line voltage. In examples, the word line voltage applied to the selected word line during the read operation (that is, 0.75 volts) is less than the word line voltage applied to the selected word line during the write operation (that is, 1.8 volts).

The word line WL1 is connected to a gate of memory cell $116_{1,1}$. Therefore, applying the word line voltage switches on transistor 120 of memory cell $116_{1,1}$ thereby connecting a second terminal of resistive element 118 of memory cell $116_{1,1}$ to the ground. In examples, the word line voltage applied to the selected word line WL1 during the read operation is also referred to as a word line read voltage or a second word line voltage which different from the word line write voltage or the first word line voltage applied to the selected word line WL1 during the write operation.

Referring back to FIG. 4, at block 440 of method 200, a bit line voltage is applied to the selected bit line. For example, the bit line voltage is applied through read path 302 by sense amplifier 108. At block 450 of FIG. 4, a first bias voltage is applied to each of a plurality of unselected word lines connecting a plurality of memory cells connected to the selected bit line except the memory cell connected to both the selected word line and the selected bit line. For example, and as shown in FIG. 5, the first bias voltage is applied to the gate of each of unselected memory cells (labeled as $116_{1,2}$, . . . , $116_{1,m}$) of the first column. In examples, the first bias voltage is a negative voltage (that is, less than 0 volt) and is approximately equal to −0.3 volt. However, other voltages are possible for the first bias voltage. The first bias voltage is provided by bias circuit 114.

Referring back to FIG. 4, at bock 460 of method 400, a second bias voltage is applied to a gate of a reference memory cell transistor 508 of reference circuit 110. The second bias voltage is greater than the supply voltage. For example, the second bias voltage is greater than 0.75 volts. However, other voltages are possible for the second bias voltage.

At block 470 of method 400, a reference current generated by the reference circuit is compared with a read current flowing through memory device 100. For example, in the read operation, a read current (Iread) flows between memory cell array 102 and sense amplifier 108 and a reference current (Iref) flows between reference circuit 110 and sense amplifier 108. The levels of the currents (Iread, Iref) are dictated by the resistances of respective memory cell array 102 and reference circuit 110. Sense amplifier 108 compares the read current (Iread) to the reference current (Iref) to sense a bit logic "0" or "1" value of data stored in memory cell $116_{1,1}$ of memory cell array 102. When it is determined that the read current (Iread) is less than the reference current (Iref), sense amplifier 108 senses a logic "1" value. Conversely, when it is determined that the read current (Iread) is greater than the reference current (Iref), sense amplifier 108 senses a logic "0" value. Sense amplifier 108 amplifies the level of that sensed bit of data and provides the amplified bit of data as an output, such that the bit of data can be read from the memory cell. In some examples, sense amplifier 108 is a differential sense amplifier. In other examples, sense amplifier 108 is a single ended sense amplifier.

In the example shown, when memory cell $116_{1,1}$ is read, a read current (Iread) flows through resistive element 118. The magnitude of the read current (Iread) corresponds to a resistance state of resistive element 118. For example, when resistive element is in a low resistance state, i.e., a parallel state, the read current (Iread) will be greater than the reference current (Iref). This indicates that the memory cell $116_{1,1}$ stores a bit logic "0" value of data therein. Conversely, when resistive element 118 is in a high resistance state, i.e., an anti-parallel state, the read current (Iread) will be less than the reference current (Iref), indicating that memory cell $116_{1,1}$ stores a bit logic "1" value of data therein. Sense amplifier 108 can compare the read current (Iread) to the reference current (Iref) to sense a bit logic "0" or "1" value of data stored in the memory cell $116_{1,1}$. Sense amplifier 108 amplifies a level of the sensed bit of data and outputs the amplified bit of data such that the bit of data stored in the memory cell $116_{1,1}$ can be read therefrom.

In examples, in order for sense amplifier 108 to accurately sense the bit of data stored in memory cell $116_{1,1}$, the amount of the reference current (Iref) may be between the amount of a read current (Iread) when resistive element 118 is in the parallel state and the amount of a read current (Iread) when resistive element 118 is in the anti-parallel state. It should be understood that resistive element 118 is susceptible to temperature and process variations. As such, in order for the reference circuit 110 to generate such a reference current (Iref), in some embodiments, reference circuit 110 includes reference circuit resistive element 506 that is of the same type as resistive element 118 of memory cell $116_{1,1}$. This allows reference circuit 110 to track temperature and process variations of resistive elements 118 of memory cell $116_{1,1}$.

In the illustrated embodiment of FIG. 5, by providing a higher voltage than the supply voltage at the gate of reference memory cell 508 of reference circuit 110, the reference current (Iref) generated by reference circuit 110 is increased. The increased reference current improves read margins compensating for leakages in unselected memory cells. In addition, applying a negative voltage at the gates of the unselected memory cells decreases the leakage current through the unselected memory cells.

For example, a threshold voltage ($V_{GS}$) of transistor 120 within the selected memory cell $116_{1,1}$ is equal to a sum of the drain-source voltage ($V_{DS}$) and the gate-drain voltage ($V_{DG}$) (i.e., $V_{GS}=V_{DS}+V_{DG}$). Transistor 118 within the selected memory cell $116_{1,1}$ has a gate voltage that is equal to the read word line voltage ($V_{WL}$), a drain voltage that is equal to the read bit-line voltage ($V_{BL}$), and a source voltage that is equal to the ground voltage. The resulting threshold voltage ($V_{GS}$) of transistor 118 within selected memory cell $116_{1,1}$ is equal to $(V_{BL})+(V_{WL}-V_{BL})$. Transistor 118 of unselected memory cell $116_{1,2}$ has a gate voltage that is equal to the bias voltage $V_B$, a drain voltage that is equal to the read bit-line voltage $V_{BL}$, and a source voltage that is equal to the ground voltage. The resulting threshold voltage ($V_{GS}$) of transistor 118 within unselected memory cell $116_{1,2}$ is equal to $(V_{BL})+(V_B-V_{BL})$. Since, $V_B$ is a negative voltage being applied to the gates of the unselected memory cell $116_{1,2}$, the threshold voltage ($V_{GS}$) of transistor 118 within unselected memory cell $116_{1,2}$ is equal to the negative voltage being applied to the gates of the unselected memory cell $116_{1,2}$. This results in reduction of the leakage current.

Moreover, in examples, the reference current (Iref) is determined by the voltage applied to reference circuit 110 and the total of the resistance of reference circuit 110 along the current path. In other words, the reference current (Iref) is proportional to the resistance of reference circuit transistor 504 and reference memory cell transistor 508 connected in series, e.g. $R_T$, and the resistance of reference memory cell resistive elements 506, e.g. $R_{BIAS}$. As such, the total resistance of reference circuit 110 in the example shown is Rtot=$R_T R_{BIAS}$. The reference current (Iref) will be V/Rtot. Hence, by increasing the second bias voltage applied to the gate of reference memory cell transistor 508, the reference current (Iref) is increased. The increased reference current (Iref) can compensate for any increase in the read current because of leakages in unselected memory cells thereby improving a difference between the read current (Iread) and the reference current (Iref) which results in improving the read cycle.

In some disclosed examples, a method for operating a memory device comprises: decoding a first address to select a bit line of a memory device; decoding a second address to select a word line of the memory device; applying a bit line voltage to the selected bit line; applying a word line voltage to the selected word line; and applying a first bias voltage to each of a plurality of unselected word lines connected to a plurality of memory cells connected to the selected bit line except a memory cell connected to both the selected bit line and the selected word line.

Additional examples include a method of performing a read operation in a memory device, the method comprising: applying a bit line voltage to a selected bit line of a memory device; applying a word line voltage to a selected word line of the memory device; applying a first bias voltage to each of a plurality of unselected word lines connected a plurality of memory cells connected to the selected bit line except a memory cell connected to both the selected bit line and the selected word line; applying a second bias voltage to a gate of a reference memory cell transistor of a reference circuit; and comparing a reference current generated by the reference circuit and a read current flowing through the memory device.

In accordance with still further examples, a memory device comprises: a word line driver connected to a memory cell array, wherein the word line driver selects a word line of the memory cell array; a bit line driver connected to the memory cell array, wherein the bit line driver selects a bit line of the memory cell array; a reference circuit to generate a reference current; a sense amplifier connected to the reference circuit and the memory cell array, wherein the sense amplifier compares a read current flowing to the memory cell array and the reference current; and a bias circuit to apply a bias voltage to a gate of a reference circuit transistor of the reference circuit.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for operating a memory device, the method comprising:
    decoding a first address to select a bit line of a memory device;
    decoding a second address to select a word line of the memory device;
    applying a word line voltage to the selected word line;
    applying a bit line voltage to the selected bit line;
    applying a first bias voltage to each of a plurality of unselected word lines connected to a plurality of memory cells connected to the selected bit line except a memory cell connected to both the selected bit line and the selected word line, the first bias voltage being different than the word line voltage applied to the selected word line, wherein applying the first bias voltage comprises applying the first bias voltage that is less than 0 volt; and
    applying a second bias voltage to a gate of a reference memory cell transistor of a reference circuit, wherein the second bias voltage is greater than a supply voltage of the memory device.

2. The method of claim 1, further comprising comparing a reference current generated by a reference circuit and a read current flowing through the memory device.

3. The method of claim 2, further comprising providing a first bit value as an output when the reference current is greater than the read current.

4. The method of claim 2, further comprising providing a second bit value as an output when the reference current is less than the read current.

5. The method of claim 1, wherein the memory device comprises a memory cell array comprising:

multiple memory cells arranged in a matrix of rows and columns, a plurality of bit lines, each of the plurality of bit lines connected to a first plurality of memory cells in a row of memory cell array; and a plurality of word lines, each of the plurality of word lines connected to a second plurality of memory cells in a column of memory cell array.

6. The method of claim 1, wherein the memory device comprises a memory cell array comprising a plurality of Magnetic Random Access Memory (MRAM) cells.

7. A method of performing a read operation in a memory device, the method comprising:
applying a word line voltage to a selected word line of a memory device;
applying a bit line voltage to a selected bit line of the memory device;
applying a first bias voltage to each of a plurality of unselected word lines connected a plurality of memory cells connected to the selected bit line except a memory cell connected to both the selected word line and the selected bit line, the first bias voltage being different than the word line voltage applied to the selected word line, wherein applying the first bias voltage comprises applying the first bias voltage that is less than 0 volt;
applying a second bias voltage to a gate of a reference memory cell transistor of a reference circuit, wherein the second bias voltage is greater than a supply voltage of the memory device; and
comparing a reference current generated by the reference circuit and a read current flowing through the memory device.

8. The method of claim 7, further comprising providing a first bit value as an output when the reference current is less than the read current.

9. The method of claim 7, further comprising providing a second bit value as an output when the reference current is greater than the read current.

10. The method of claim 7, further comprising disabling a write path before performing a read operation on the memory device.

11. The method of claim 7, further comprising:
disabling a write path before performing a read operation on the memory device; and
enabling a write path before performing the read operation on the memory device.

12. The method of claim 7, further comprising performing a write operation in the memory device, wherein performing the write operation in the memory device further comprises:
enabling a write path before performing the write operation on the memory device; and
disabling the write path before performing the read operation on the memory device.

13. A memory device comprising:
a word line decoder connected to a memory cell array, wherein the word line decoder selects a word line of the memory cell array;
a bit line decoder connected to the memory cell array, wherein the bit line decoder selects a bit line of the memory cell array;
a reference circuit to generate a reference current;
a sense amplifier connected to the reference circuit and the memory cell array, wherein the sense amplifier compares a read current flowing to the memory cell array and the reference current; and
a bias circuit configured to:
apply a first bias voltage to a to each of a plurality of unselected word lines connected to a plurality of memory cells connected to the selected bit line except a memory cell connected to both the selected word line and the selected bit line, the first bias voltage being different than a word line voltage applied to the selected word line, wherein applying the first bias voltage comprises applying the first bias voltage that is less than 0 volt, and
apply a second bias voltage to a gate of a reference memory cell transistor of the reference circuit, wherein the second bias voltage is greater than a supply voltage of the memory device.

14. The memory device of claim 13, wherein the first bias voltage is −0.3 volt.

15. The memory device of claim 13, wherein the memory cell array comprises:
multiple memory cells arranged in a matrix of rows and columns,
a plurality of bit lines, each of the plurality of bit lines connected to a first plurality of memory cells in a row of memory cell array; and
a plurality of word lines, each of the plurality of word lines connected to a second plurality of memory cells in a column of memory cell array.

16. The memory device of claim 13, wherein the memory cell array comprises a plurality of Magnetic Random Access Memory (MRAM) cells.

17. The memory device of claim 13, wherein the second bias voltage is greater than 0.75 volt.

18. The memory device of claim 13, wherein the bias circuit is further configured to:
apply a third bias voltage to another selected word line for a write operation, wherein the third bias voltage is greater than the second bias voltage.

19. The memory device of claim 13, wherein the bias circuit comprises:
a negative voltage generator circuit to generate the first bias voltage; and
a charge pump to generate the second bias voltage.

20. The memory device of claim 13, wherein the first bias voltage and the second bias voltage are applied during a read operation.

* * * * *